United States Patent [19]

Braun

[11] 3,723,893

[45] Mar. 27, 1973

[54] PARAMETRIC AMPLIFIER

[75] Inventor: Lorne D. Braun, Knata, Ontario, Canada

[73] Assignee: Canadian Patents and Development Limited, Ottawa, Canada

[22] Filed: Aug. 6, 1971

[21] Appl. No.: 169,700

[52] U.S. Cl. ....................................330/4.9, 330/56

[51] Int. Cl. ....................................H03f 7/04

[58] Field of Search ....................................330/4.9

[56] References Cited

UNITED STATES PATENTS

| | | | |
|---|---|---|---|
| 3,105,941 | 10/1963 | Kliphuis | 330/4.9 |
| 3,230,464 | 1/1966 | Grace | 330/4.9 |
| 3,391,346 | 2/1968 | Uhlir | 330/4.9 |

*Primary Examiner*—Roy Lake
*Assistant Examiner*—Darwin R. Hostetter
*Attorney*—James R. Hughes

[57] ABSTRACT

A parametric amplifier comprising a housing formed of conductive material defining a first cavity adapted for connection to a pump signal input at microwave frequencies and a second cavity containing a spaced central conductor and adapted for coaxial connection to a signal input and output port, said first and second cavities being connected through an aperture in the housing, a capacitor or reactance and varactor positioned in the first cavity and connected in series across two walls thereof, and an inductor positioned in the second cavity and connected to an end of the central conductor and via an electrical lead passing through the aperture to the mid-point of the series connected capacitor and varactor.

7 Claims, 3 Drawing Figures

PARAMETRIC AMPLIFIER

This invention relates to parametric amplifiers.

Parametric amplifiers, because of their low-noise characteristics have found widespread application as high frequency amplifiers. In order to obtain both low-noise operation and a large bandwidth the amplifier should contain few circuit elements that could impair the low-noise operation or the inherent bandwidth obtainable. Consequently a major problem in designing a parametric amplifier is to design a simple circuit that contains a minimum of elements which could degrade the performance of the amplifier.

A parametric amplifier generally contains one or more variable reactance devices, often called variable capacitors or varactors. A pump voltage of sufficient amplitude is applied to the varactor and causes the reactance of the device to vary at that frequency and its harmonics. A signal is also applied to the varactor and is consequently amplified, and at the same time, may be converted to a new frequency. The pump frequency is usually higher than the signal frequency. During the process of amplification, frequencies relating to the sum and difference of the pump frequency and signal frequency can be produced by the varactor. One of the most common forms of parametric amplifiers is one in which only the difference frequency, called the idler frequency, is allowed with the remaining components being suppressed. For this mode of operation the pump frequency is generally much higher than the signal frequency and amplification can take place at the signal frequency without additional frequency conversion. For this type of amplifier it is necessary that proper impedances are presented to the diode at the signal, pump, and idler frequencies. This type of amplifier requires three separate circuits, one for each of the signal, pump, and idler frequencies.

The conventional approach to this problem has been to incorporate in the signal circuit elaborate filters to prevent both the idler and pump frequencies from propagating in that circuit. These filters may restrict the bandwidth of the amplifier and because they are not lossless, may also degrade the noise performance of the amplifier. A second approach has been to use balanced diodes, either two or four essentially identical diodes and to pump them in such a manner that the currents flowing through the diodes are out of phase at the idler frequency and hence cancel. In this manner it may not be necessary to provide filters in some of the circuits. This type of circuit is shown in U.S. Pat. No. 3,105,941 entitled "Parametric Amplifier with Balanced Self-Resonant Diodes" issued to J. Kliphuis on Oct. 1, 1963. This type of amplifier is very useful but does suffer from the fact that at least two identical varactors, each resonant at the idler frequency, are required.

It is an object of the invention to provide a parametric amplifier that requires only one varactor and only a simple filter.

It is another object of the invention to provide a parametric amplifier that is simple in construction, has broad bandwidth characteristics, and gives low noise operation.

These and other objects of the invention are achieved by a parametric amplifier comprising a housing formed of conductive material defining a first cavity adapted for connection to a pump signal input at microwave frequencies and a second cavity containing a spaced central conductor and adapted for coaxial connection to a signal input and output port, said first and second cavities being connected through an aperture in the housing, a capacitor or reactance and varactor positioned in the first cavity and connected in series across two walls thereof, and an inductor positioned in the second cavity and connected to an end of the central conductor and via an electrical lead passing through the aperture to the mid-point of the series connected capacitor and varactor.

In drawings which illustrate an embodiment of the invention,

Figure 1:
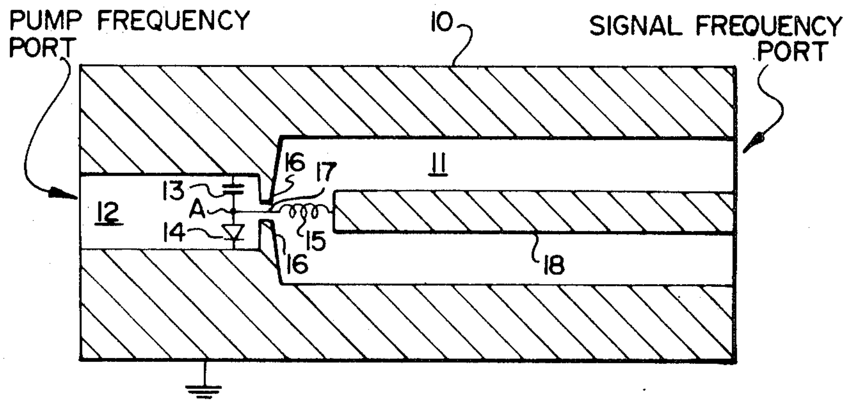
FIG. 1 shows a cross-section of a parametric amplifier.

Referring to FIG. 1, a housing 10 which would be of conducting material or having its inner surfaces of conducting material defines a first microwave cavity 12 which in essence is a length of waveguide. The dimensions of the cavity are chosen to transmit the frequencies of the pump signal and suitable connections (not shown) to the pump signal waveguide would be provided. A filter in this circuit to prevent idler currents from propagating out of the pump frequency port normally forms part of the auxiliary circuitry and is not shown here. A capacitor 13 and a varactor 14 are connected in series across two walls which would normally operate at ground potential. This means that the capacitor and varactor are effectively in parallel as between the mid-point connection A and ground. A cavity 11 has a central conductor 18 which in essence makes this cavity a section of a coaxial line. Suitable connections (not shown) would be provided for joining to a coaxial line carrying the signal frequency. Conductor 18 may be the extended end of the central conductor of the incoming coaxial line or may be positioned by suitable dielectric spacers or the whole cavity 11 may be filled with dielectric material. An inductor 15 is connected between the end of center conductor 18 and via a wire 17 to the mid-point A through the intercavity aperture formed by the inwardly extending flange 16 of the housing.

No additional filters are required in the signal circuit. A three-port circulator or a similar device would be required at the signal circuit port to separate the input signal from the amplified signal obtained, but this is conventional and is, therefore, not shown. A capacitor is shown but it would also be possible to utilize an inductor provided that means were provided to bias the varactor with a DC voltage.

Figure 2:
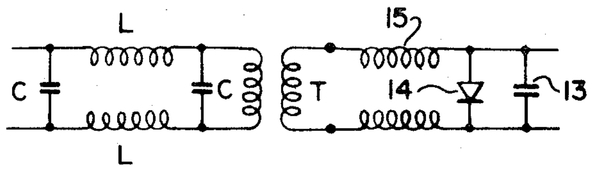
FIG. 2 shows the equivalent circuit at the signal frequency.
Figure 3:
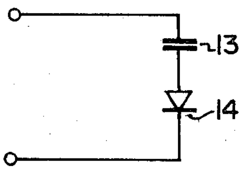
FIG. 3 shows the equivalent circuit at the pump frequency.

FIG. 2 shows the equivalent circuit of the signal circuit with L, C, and T representing the coaxial transmission line. The signal circuit sees the inductor 15 in series with the capacitor and varactor in parallel. The inductance is required to resonate, at the signal frequency, with the average capacitance of the combination of the varactor and the fixed capacitor. The effect of the inductance connected to the varactor in the signal circuit is also to prevent any pump or idler frequency signals from propagating into that signal circuit. As a consequence, no additional filters are required in the signal circuit. FIG. 3 shows equivalent circuit as seen at the idler frequency. At this frequency the capacitor and varactor are effectively in series.

The correct idler frequency impedance presented to the varactor diode is obtained by a properly dimensioned cavity structure or by adjustment of a variable reactance such as a short circuit termination. Conventional tuning elements would be required to properly match the varactor to the pump frequency source.

The varactor or variable capacitor is standard and suitable devices are available commercially. For some applications of the amplifier it may be necessary to provide a DC bias voltage to the central conductor of the coaxial section and this may be readily done by an input from an external DC source.

Instead of the coaxial line signal cavity a microstrip transmission line of the TEM or quasi-TEM type could be substituted with no complications.

The parametric amplifier described herein can be used in any situation requiring a low noise amplifier, e.g. communication systems operating at microwave frequencies, ground stations for satellite communication systems, and eventually, home receivers for direct satellite to home communication links.

What is claimed:

1. A parametric amplifier comprising:

a. a housing formed of conductive material and defining first and second interconnected cavities, b. a varactor and a reactance element positioned in the first cavity, c. an inductor positioned in the second cavity, d. said varactor, said reactance element, and said inductor being electrically interconnected such that a microwave input signal to the first cavity at a pump frequency and a microwave input signal to the second cavity at a signal frequency produce a third signal at an idler frequency related to the pump and signal frequencies.

2. A parametric amplifier as in claim 1 wherein the reactance element is a capacitor.

3. A parametric amplifier as in claim 1 wherein the varactor and reactance element are connected in series across two walls of the said first cavity and the inductor is positioned in the second cavity and connected at one end to the mid-point between the varactor and the reactance element and having its other end adapted for connection to a conductor of an input transmission line.

4. A parametric amplifier comprising:

a. a housing formed of conductive material defining a first cavity adapted for connection to a pump signal input at microwave frequencies and a second cavity adapted for connection to a signal frequency microwave transmission line and containing a spaced conductor, b. said first and second cavities being connected through an aperture in the housing, c. a reactance element and a varactor positioned in the first cavity and connected in series across two walls thereof, d. an inductor positioned in the second cavity and connected to an end of the said spaced conductor and via an electrical lead passing through the aperture to the mid-point of the series connected reactance element and the varactor.

5. A parametric amplifier as in claim 4 wherein the reactance element is a capacitor.

6. A parametric amplifier as in claim 4 wherein the spaced conductor is the central conductor of a coaxial transmission line.

7. A parametric amplifier as in claim 4 wherein the spaced conductor is the central conductor of a microstrip transmission line of the TEM or quosi-TEM type.

* * * * *